(12) United States Patent
Endo et al.

(10) Patent No.: US 11,881,419 B2
(45) Date of Patent: Jan. 23, 2024

(54) SUBSTRATE PROCESSING APPARATUS

(71) Applicant: SCREEN Holdings Co., Ltd., Kyoto (JP)

(72) Inventors: Toru Endo, Kyoto (JP); Masayuki Hayashi, Kyoto (JP); Nobuyuki Shibayama, Kyoto (JP)

(73) Assignee: SCREEN Holdings Co., Ltd.

( * ) Notice: Subject to any disclaimer, the term of this patent is extended or adjusted under 35 U.S.C. 154(b) by 532 days.

(21) Appl. No.: 17/158,082

(22) Filed: Jan. 26, 2021

(65) Prior Publication Data

US 2021/0151332 A1 May 20, 2021

Related U.S. Application Data

(62) Division of application No. 16/361,304, filed on Mar. 22, 2019, now Pat. No. 10,978,317.

(30) Foreign Application Priority Data

Mar. 26, 2018 (JP) .................................. 2018-057502

(51) Int. Cl.
| | |
|---|---|
| *H01L 21/06* | (2006.01) |
| *H01L 21/687* | (2006.01) |
| *H01L 21/02* | (2006.01) |
| *H01L 21/67* | (2006.01) |

(52) U.S. Cl.
CPC .... *H01L 21/6708* (2013.01); *H01L 21/67023* (2013.01); *H01L 21/67028* (2013.01); *H01L 21/67051* (2013.01); *H01L 21/02057* (2013.01); *H01L 21/68714* (2013.01); *H01L 21/68721* (2013.01)

(58) Field of Classification Search
CPC ............. H01L 21/6704; H01L 21/6708; H01L 21/67023; H01L 21/67028; H01L 21/67051; H01L 21/67075
See application file for complete search history.

(56) References Cited

U.S. PATENT DOCUMENTS

| 2008/0142051 A1 | 6/2008 | Hashizume ..................... 134/23 |
| 2015/0040951 A1 | 2/2015 | Yoshizumi et al. ............. 134/26 |
| 2015/0090301 A1 | 4/2015 | Higuchi et al. ................. 134/23 |
| 2016/0271655 A1 | 9/2016 | Kashiyama et al. |

(Continued)

FOREIGN PATENT DOCUMENTS

| JP | H11-033468 A | 2/1999 |
| JP | 2010-010555 A | 1/2010 |

(Continued)

*Primary Examiner* — Spencer E. Bell
(74) *Attorney, Agent, or Firm* — OSTROLENK FABER LLP

(57) ABSTRACT

A substrate processing method includes a substrate holding step of holding a substrate in a horizontal attitude, a chemical liquid supply step of supplying a chemical liquid to a main surface of the substrate while rotating the substrate around a vertical rotational axis that passes through a central portion of the substrate, a processing-height maintaining step of maintaining a cylindrical first guard that captures a chemical liquid expelled from the substrate at a processing height position in parallel with the chemical liquid supply step, and a cleaning-height maintaining step of maintaining the first guard at a cleaning height position set below the processing height position in parallel with the chemical liquid supply step after the processing-height maintaining step.

6 Claims, 7 Drawing Sheets

(56) References Cited

U.S. PATENT DOCUMENTS

| | | | |
|---|---|---|---|
| 2018/0025922 A1 | 1/2018 | Tsujikawa et al. | |
| 2018/0029089 A1 | 2/2018 | Miura et al. | |
| 2018/0061633 A1 | 3/2018 | Hinode et al. | |
| 2018/0085795 A1 | 3/2018 | Tsuchihashi et al. | |
| 2018/0090342 A1 | 3/2018 | Hinode et al. | |

FOREIGN PATENT DOCUMENTS

| | | |
|---|---|---|
| KR | 10-2016-0113020 A | 9/2016 |
| KR | 10-2016-0147163 A | 12/2016 |
| TW | 200910494 A | 3/2009 |
| TW | 201517998 A | 5/2015 |

SUBSTRATE PROCESSING APPARATUS

CROSS REFERENCE TO RELATED APPLICATIONS

The present application is a divisional of U.S. patent application Ser. No. 16/361,304, filed on Mar. 22, 2019, which claims the benefit of priority to Japanese Patent Application No. 2018-057502, filed on Mar. 26, 2018. The entire contents of both of these applications are hereby incorporated herein by reference.

BACKGROUND OF THE INVENTION

1. Field of the Invention

The present invention relates to a substrate processing method and a substrate processing apparatus. Examples of substrates to be processed include semiconductor wafers, substrates for FPDs (flat panel displays) such as liquid crystal displays, etc., plasma displays, or organic EL (electroluminescence) displays, substrates for optical disks, substrates for magnetic disks, substrates for magneto-optical disks, substrates for photomasks, ceramic substrates, and substrates for solar cells, etc.

2. Description of Related Art

U.S. Unexamined Patent Application Publication No. 2018/025922 A1 discloses a single-substrate processing type apparatus that processes substrates one by one. A processing unit of the substrate processing apparatus includes a spin chuck that rotates a substrate while horizontally holding the substrate, a chemical liquid nozzle that expels a chemical liquid toward an upper surface of a substrate held by the spin chuck, and a cylindrical processing cup that surrounds the spin chuck. A flow space into which a chemical liquid that has been used for substrate processing is guided is defined in the processing cup.

Also, the processing unit of United States Patent Application Publication No. 2018/025922 is configured to collect a chemical liquid that has been used for substrate processing so that the recovered chemical liquid can be reused in subsequent steps. Therefore, the substrate processing apparatus additionally includes a chemical liquid tank that stores a chemical liquid that is supplied to the chemical liquid nozzle and a recovery piping that guides a chemical liquid from the flow space to the chemical liquid tank. The processing cup includes a guard that has an inner wall serving to capture a processing liquid scattering from around the substrate.

Also, U.S. Unexamined Patent Application Publication No. 2015/090301 A1 describes a technique in which the inner wall of the guard is cleaned with a cleaning liquid, so that extraneous substances adhering to the inner wall are removed. More specifically, U.S. Unexamined Patent Application Publication No. 2015/090301 A1 discloses that the scattering direction of a rinse liquid (a cleaning liquid) scattering from a substrate in parallel with a rinsing step is changed, and hence extraneous substances are removed from the inner wall of the guard by use of the rinse liquid.

SUMMARY OF THE INVENTION

Substrate processing performed in the processing unit includes cleaning in which contaminants, such as particles, etc., or to-be-removed substances, such as resists, etc., (hereinafter referred to collectively as "contaminants") are removed from a substrate and etching in which films are removed from a substrate. Therefore, there is a fear that foreign substances, such as these contaminants and films, etc., will be included in a chemical liquid expelled from the substrate. The chemical liquid including such foreign substances is required to be restrained or prevented from being recovered.

Therefore, it is conceivable that a chemical liquid captured by the guard in parallel with a period in which a chemical liquid expelled from the substrate includes foreign substances is thrown away whereas a chemical liquid captured by the guard in parallel with a period in which a chemical liquid expelled from the substrate does not include foreign substances is recovered.

However, a chemical liquid including foreign substances and a chemical liquid not including foreign substances are caught by the shared guard, and therefore there is a fear that the foreign substances will be transferred to the chemical liquid not including foreign substances through the inner wall of the guard. As a result, there is a fear that foreign substances will mix with the chemical liquid that does not originally include foreign substances.

Therefore, in the processing cup, the chemical liquid including foreign substances is required to be removed from the inner wall of the guard.

Also, the cleaning mentioned in United States Patent Application Publication No. 2015090301 is processing to be executed in rinsing that is performed after chemical-liquid processing (processing in which a chemical liquid is used). Therefore, the cleaning mentioned therein is inapplicable to the present case in which a chemical liquid is removed in parallel with chemical-liquid processing.

That is, in parallel with chemical-liquid processing, it has been desired to remove remaining foreign substances from the inner wall of the guard.

Therefore, an object of the present invention is to provide a substrate processing method and a substrate processing apparatus capable of excellently removing remaining foreign substances from the inner wall of the guard.

The present invention provides a substrate processing method including a substrate holding step of holding a substrate in a horizontal attitude, a chemical liquid supply step of supplying a chemical liquid to a main surface of the substrate while rotating the substrate around a vertical rotational axis that passes through a central portion of the substrate, a processing-height maintaining step of maintaining a cylindrical first guard that captures a chemical liquid expelled from the substrate at a processing height position in parallel with the chemical liquid supply step, and a cleaning-height maintaining step of maintaining the first guard at a cleaning height position set below the processing height position in parallel with the chemical liquid supply step after the processing-height maintaining step.

A large amount of foreign substances are included in a chemical liquid expelled from the substrate for a time after the chemical liquid supply step is started. That is, a chemical liquid including foreign substances is introduced into the processing cup. With the lapse of time after the chemical liquid supply step is started, chemical-liquid processing in the substrate progresses, and the amount of foreign substances included in the chemical liquid expelled from the substrate becomes smaller. Thereafter, when a predetermined period of time elapses after the chemical liquid supply step is started, foreign substances come not to be included in the chemical liquid expelled from the substrate. The expression "foreign substances are not included in the chemical liquid" semantically includes a case of "foreign substances are not included in the chemical liquid at all," a case of "foreign substances are hardly included in the chemical liquid," and a case of "only a tiny amount of foreign substances are included in the chemical liquid."

With this method, in the chemical liquid supply step, the first guard is positionally changed to the cleaning height position set below the processing height position from the processing height position at which the first guard has been so far arranged, and then the first guard is maintained at the cleaning height position for a predetermined period of time.

Both in a state in which the first guard is arranged at the processing height position and in a state in which the first guard is arranged at the cleaning height position, a chemical liquid expelled from the substrate is captured by the inner wall of the first guard. The chemical liquid captured by the inner wall of the first guard flows downwardly because of its own weight.

From a viewpoint based on the inner wall of the first guard, a region in the inner wall to capture a chemical liquid is positionally higher in a state in which the first guard is arranged at the cleaning height position than in a state in which the first guard is arranged at the processing height position. Therefore, it is possible to excellently wash away a chemical liquid captured by the first guard arranged at the processing height position (i.e., excellently wash away a chemical liquid including foreign substances) by means of a chemical liquid captured by the first guard arranged at the cleaning height position. This makes it possible to excellently remove remaining foreign substances from the inner wall of the first guard.

In one preferred embodiment of the present invention, the processing height position is a height position that enables capturing a chemical liquid expelled from the substrate in a first region. The cleaning height position is a height position that enables capturing a chemical liquid expelled from the substrate in a second region that is set above an upper end of an arrival region to which the chemical liquid captured in the first region is reachable.

With this method, the second region is set above the upper end of the arrival region to which the chemical liquid captured in the first region, which the inner wall of the first guard arranged at the processing height position captures, is reachable. Therefore, it is possible to excellently wash away substantially all of the chemical liquid including foreign substances, which adhere to the inner wall of the first guard, by means of the chemical liquid captured by the first guard arranged at the cleaning height position.

In one preferred embodiment of the present invention, the substrate processing method further includes a guard switching step of, after the cleaning-height maintaining step, switching a guard arranged at a position that enables capturing a chemical liquid expelled from the substrate from the first guard to a cylindrical second guard provided separately from the first guard.

With this method, prior to the switching of the guard arranged at a position that enables capturing a chemical liquid from the first guard to the second guard, the first guard is positionally changed to the cleaning height position from the processing height position at which the first guard has been so far arranged. Thereafter, the first guard is maintained at the cleaning height position for a predetermined period of time. Prior to guard switching, the first guard is arranged at the cleaning height position so as to clean the inner wall of the first guard, and therefore it is possible to remove a resist from the inner wall of the first guard before finishing the use of the first guard.

In one preferred embodiment of the present invention, the guard switching step includes a step of, after the cleaning-height maintaining step, switching a guard arranged at a position that enables capturing a chemical liquid expelled from the substrate from the first guard to the second guard without again executing the processing-height maintaining step.

With this method, it is possible to perform guard switching immediately after the first guard is cleaned. Hence, it is possible to shorten the processing time.

As in one preferred embodiment of the present invention, the substrate processing method may further include a different-liquid supply step of supplying the substrate with another processing liquid differing in kind from a chemical liquid supplied to the substrate while rotating the substrate around the rotational axis and a step of placing the first guard at a position that enables capturing another processing liquid expelled from the substrate in parallel with the different-liquid supply step.

A resist may be formed on the main surface of the substrate. Also, a chemical liquid supplied to the main surface of the substrate in the chemical liquid supply step may include an SPM.

In the chemical liquid supply step, a resist formed on the substrate is removed by an SPM. A large amount of resist residues are included in the SPM expelled from the substrate after the chemical liquid supply step is started. Therefore, there is a fear that resist residues will remain in the inner wall of the first guard by allowing the inner wall of the first guard to capture an SPM that includes a large amount of resist residues.

With this method, it is possible to excellently remove remaining resist residues from the inner wall of the first guard.

The present invention provides a substrate processing apparatus including a substrate holding unit that holds a substrate, a rotation unit that rotates a substrate held by the substrate holding unit around a rotational axis passing through a central portion of the substrate, a chemical liquid supply unit that supplies a chemical liquid to a substrate held by the substrate holding unit, a first guard that surrounds a periphery of the substrate holding unit and that captures a liquid expelled from a substrate held by the substrate holding unit, a guard elevating/lowering unit that raises and lowers the first guard, and a controller that controls the rotation unit, the chemical liquid supply unit, and the guard elevating/lowering unit, and the controller executes a chemical liquid supply step of supplying a chemical liquid to the substrate while rotating the substrate around the rotational axis, a processing-height maintaining step of maintaining a cylindrical first guard at a processing height position in parallel with the chemical liquid supply step, and a cleaning-height maintaining step of maintaining the first guard at a cleaning height position lower than the processing height position in parallel with the chemical liquid supply step after the processing-height maintaining step.

With this arrangement, in the chemical liquid supply step, the first guard is positionally changed to the cleaning height position set below the processing height position from the processing height position at which the first guard has been so far arranged, and then the first guard is maintained at the cleaning height position for a predetermined period of time.

A large amount of foreign substances are included in the chemical liquid expelled from the substrate after the chemical liquid supply step is started. With the lapse of time after the chemical liquid supply step is started, chemical-liquid processing in the substrate progresses, and the amount of foreign substances included in the chemical liquid expelled from the substrate becomes smaller. Thereafter, when a predetermined period of time elapses after the chemical liquid supply step is started, foreign substances come not to be included in the chemical liquid expelled from the substrate.

A chemical liquid including foreign substances is captured by the first guard after the chemical liquid supply step is started. Also, after a predetermined period of time elapses, the first guard is positionally changed to the cleaning height position lower than the processing height position.

Likewise, in a state in which the first guard is arranged at the cleaning height position, a chemical liquid expelled from the substrate is captured by the inner wall of the first guard. From a viewpoint based on the inner wall of the first guard, a region in the inner wall of the first guard in which a chemical liquid is captured is arranged at a higher position in a case in which the first guard is arranged at the processing height position than in a case in which the first guard is arranged at the cleaning height position. Therefore, in a state in which the first guard is arranged at the cleaning height position, the chemical liquid captured by the inner wall of the first guard flows downwardly. Thereafter, this chemical liquid enables cleaning away the chemical liquid including foreign substances captured by the inner wall of the first guard arranged at the processing height position. Hence, it is possible to excellently remove remaining foreign substances from the inner wall of the first guard.

In one preferred embodiment of the present invention, the processing height position is a height position that enables capturing a chemical liquid expelled from the substrate in a first region, and the cleaning height position is a height position that enables capturing a chemical liquid expelled from the substrate in a second region that is set above an upper end of an arrival region to which the chemical liquid captured in the first region is reachable.

With this arrangement, the second region is set above the upper end of the arrival region to which the chemical liquid captured in the first region, which is captured by the inner wall of the first guard arranged at the processing height position, is reachable. Therefore, it is possible to excellently wash away substantially all of the chemical liquid including foreign substances, which adhere to the inner wall of the first guard, by means of the chemical liquid captured by the first guard arranged at the cleaning height position.

In one preferred embodiment of the present invention, the substrate processing apparatus further includes a second guard that is provided separately from the first guard and that surrounds a periphery of the substrate holding unit and that captures a liquid expelled from a substrate held by the substrate holding unit. The controller further executes a guard switching step of, after the cleaning-height maintaining step, switching a guard arranged at a position that enables capturing a chemical liquid expelled from the substrate from the first guard to the second guard.

With this arrangement, prior to the switching of a guard arranged at a position enabling the capture of a chemical liquid from the first guard to the second guard, the first guard is positionally changed to the cleaning height position from the processing height position at which the first guard has been so far arranged. Thereafter, the first guard is maintained at the cleaning height position for a predetermined period of time. Prior to guard switching, the first guard is arranged at the cleaning height position, and the inner wall of the first guard is cleaned, and therefore the first guard has already been cleaned when the guard is switched, and a chemical liquid including foreign substances does not adhere to the inner wall of the first guard.

In one preferred embodiment of the present invention, the controller executes a step of, after the cleaning-height maintaining step, switching a guard arranged at a position that enables capturing a chemical liquid expelled from the substrate from the first guard to the second guard without again executing the processing-height maintaining step in the guard switching step.

With this arrangement, it is possible to perform guard switching immediately after the first guard is cleaned. Hence, it is possible to shorten the processing time.

The substrate processing apparatus may further include a different-liquid supply unit that supplies a substrate held by the substrate holding unit with one other processing liquid differing in kind from a chemical liquid supplied to the substrate. In this case, the controller may further execute a different-liquid supply step of supplying the substrate with the one other processing liquid while rotating the substrate around the rotational axis and a step of placing the first guard at a position that enables capturing another processing liquid expelled from the substrate in parallel with the different-liquid supply step.

A resist may be formed on the main surface of the substrate. Also, a chemical liquid supplied to the main surface of the substrate in the chemical liquid supply step may include an SPM.

In the chemical liquid supply step, the resist formed on the substrate is removed by the SPM. After the chemical liquid supply step is started, a large amount of resist residues are included in the SPM expelled from the substrate. Therefore, there is a fear that resist residues will remain in the inner wall of the first guard by allowing the inner wall of the first guard to capture an SPM that includes a large amount of resist residues.

With this arrangement, it is possible to excellently remove remaining resist residues from the inner wall of the first guard.

The aforementioned or other objects, features, and effects of the present invention will be clarified by the following description of preferred embodiments given below with reference to the accompanying drawings.

DETAILED DESCRIPTION OF PREFERRED EMBODIMENTS

Figure 1:
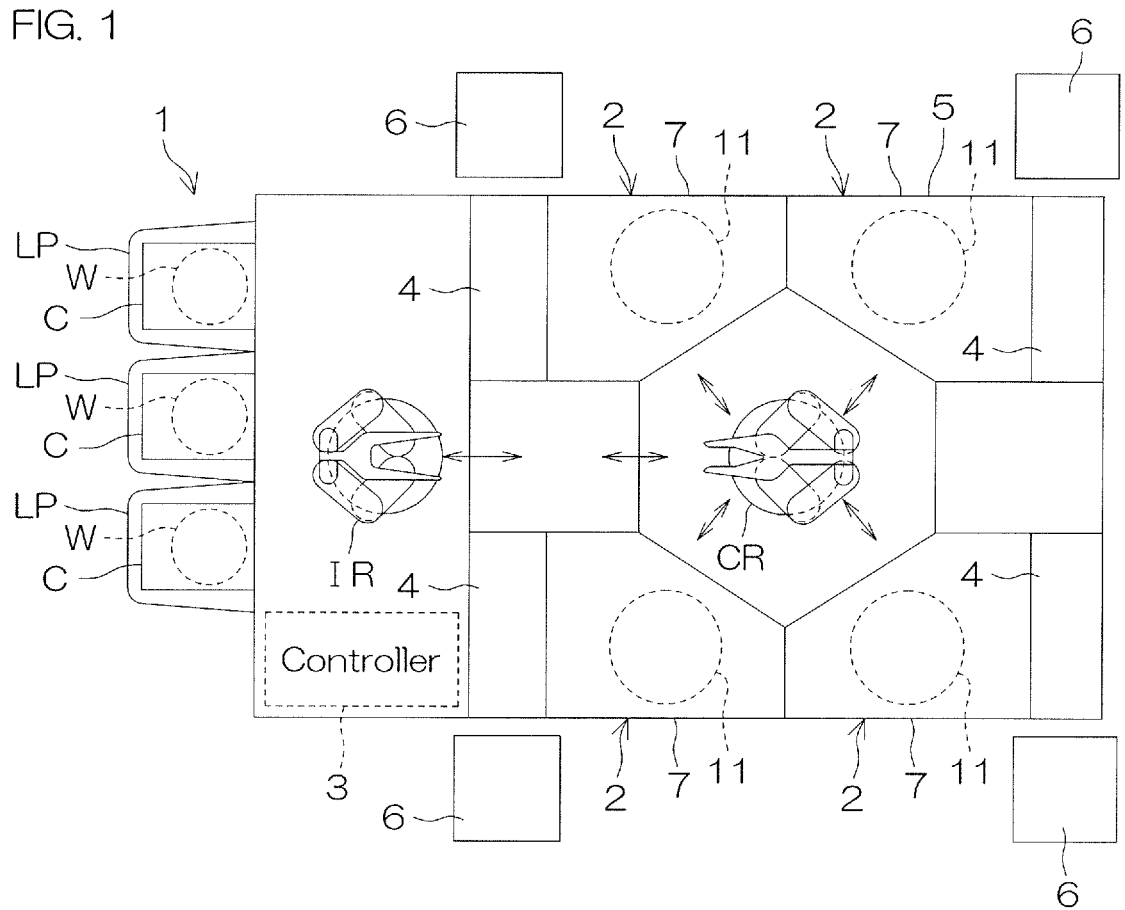
FIG. 1 is an illustrative plan view to describe a layout of the inside of a substrate processing apparatus according to a preferred embodiment of the present invention.

FIG. 1 is an illustrative plan view to describe a layout of the inside of a substrate processing apparatus 1 according to a preferred embodiment of the present invention. The substrate processing apparatus 1 is a single-substrate processing type apparatus that processes disk-shaped substrates W, such as semiconductor wafers, etc., one by one.

The substrate processing apparatus 1 includes a plurality of load ports LP each of which holds a substrate container C that contains a substrate W, a plurality of (for example, twelve) processing units 2 each of which processes a substrate W transferred from each of the load ports LP by use of a processing liquid, such as a chemical liquid, etc., a transfer robot that transfers a substrate W from each of the load ports LP to each of the processing units 2, and a controller 3 that controls the substrate processing apparatus 1. The transfer robot includes an indexer robot IR that transfers a substrate W on a path between the load port LP and the processing unit 2 and a substrate transfer robot CR that transfers a substrate W on a path between the indexer robot IR and the processing unit 2.

The substrate processing apparatus 1 includes a plurality of fluid boxes 4 each of which houses, for example, a valve and a storage box 6 that houses, for example, a sulfuric-acid tank 27 (see FIG. 2) that stores sulfuric acid. The processing unit 2 and the fluid box 4 are disposed inside a frame 5 of the substrate processing apparatus 1, and are covered with the frame 5 of the substrate processing apparatus 1. The storage box 6 may be housed in the frame 5 although the storage box 6 is disposed outside the frame 5 of the substrate processing apparatus 1 in an example of FIG. 1. The storage box 6 may be a single box corresponding to the plurality of fluid boxes 4, or may be provided in the form of a plurality of boxes corresponding to the plurality of fluid boxes 4 in a one-on-one relationship.

The twelve processing units 2 form four towers disposed so as to surround the substrate transfer robot CR in a plan view. Each tower includes three processing units 2 stacked up and down. The four storage boxes 6 correspond to the four towers, respectively. Likewise, the four fluid boxes 4 correspond to the four towers, respectively. Sulfuric acid stored in the sulfuric-acid tank 27 in each storage box 6 is supplied to the three processing units 2 corresponding to the storage box 6 through the fluid box 4 corresponding to the storage box 6.

Figure 2:
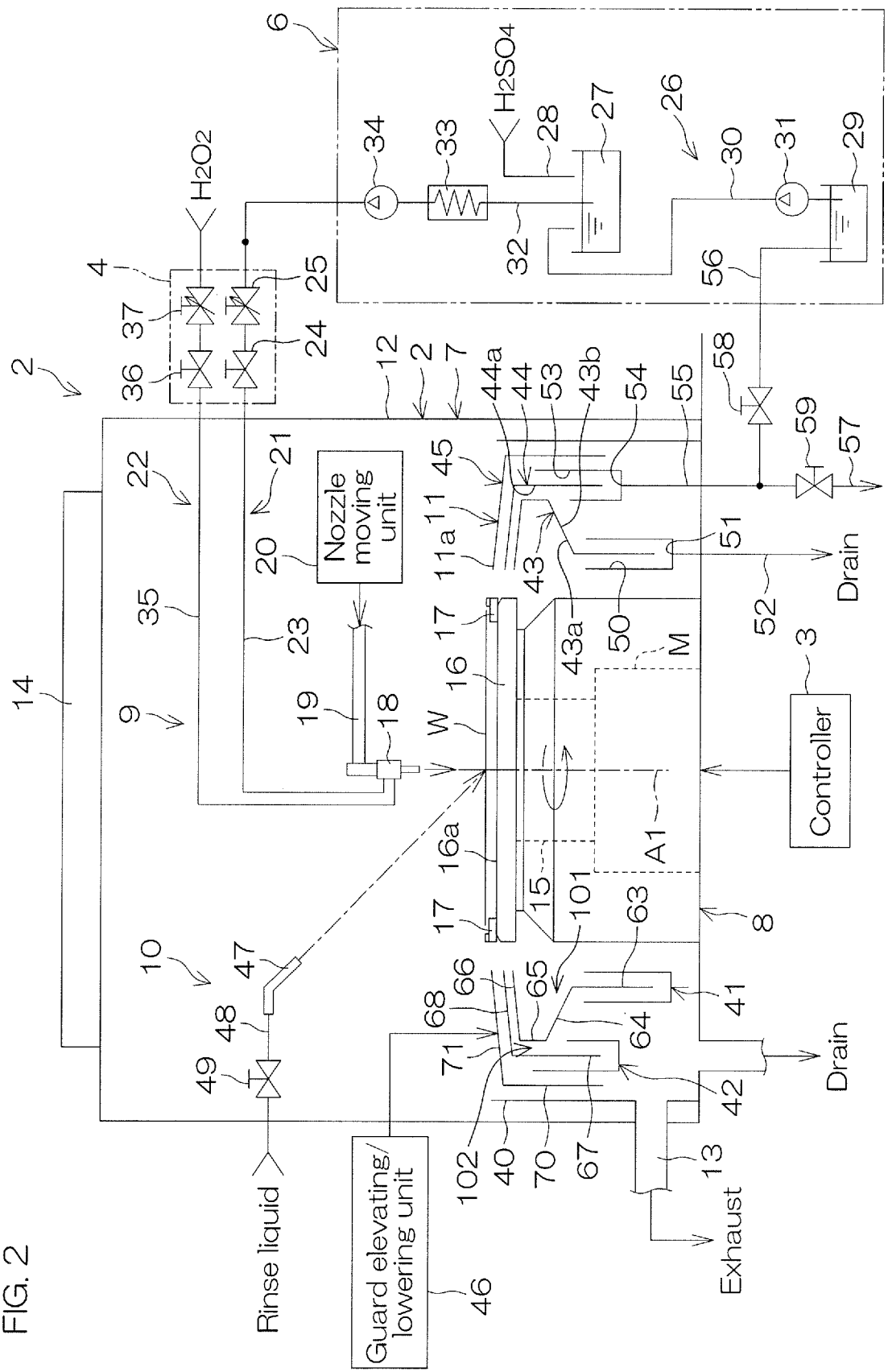
FIG. 2 is an illustrative sectional view to describe a configuration example of a processing unit included in the substrate processing apparatus.

FIG. 2 is an illustrative sectional view to describe a configuration example of the processing unit 2. The processing unit 2 includes a box-shaped chamber 7 that has an internal space, a spin chuck (substrate holding unit) 8 that rotates a substrate W around a vertical rotational axis A1 passing through the center of the substrate W while holding the single substrate W in a horizontal attitude in the chamber 7, an SPM supply unit (chemical liquid supply unit) 9 that supplies an SPM (sulfuric acid/hydrogen peroxide mixture, i.e., a mixed liquid including $H_2SO_4$ (sulfuric acid) and $H_1O_2$ (hydrogen peroxide water)), which is an example of the chemical liquid, to an upper surface of the substrate W held by the spin chuck 8, a rinse liquid supply unit (different-liquid supply unit) 10 that supplies a rinse liquid to the upper surface of the substrate W held by the spin chuck 8, and a cylindrical processing cup 11 that surrounds the spin chuck 8.

The chamber 7 includes a box-shaped partition wall 12, an FFU (fan filter unit) 14 serving as a as the blower unit that sends clean air from an upper portion of the partition wall 12 to the inside of the partition wall 12 (which is equivalent to the inside of the chamber 7), and an exhaust device (not shown) that discharges a gas present in the chamber 7 from a lower portion of the partition wall 12.

The FFU 14 is disposed on the partition wall 12, and is attached to a ceiling of the partition wall 12 as shown in FIG. 2. The FFU 14 sends clean air from the ceiling of the partition wall 12 to the inside of the chamber 7. The exhaust device (not shown) is connected to a bottom portion of the processing cup 11 through an exhaust duct 13 connected to the inside of the processing cup 11, and suctions the inside of the processing cup 11 from the bottom portion of the processing cup 11. A downflow (downward flow) is formed by both the FFU 14 and the exhaust device (not shown) in the chamber 7.

A gripping-type chuck that horizontally holds a substrate W while squeezing the substrate W in a horizontal direction is employed as the spin chuck 8. Specifically, the spin chuck 8 includes a spin motor (rotation unit) M, a spin shaft 15 formed integrally with a driving shaft of the spin motor M, and a disk-shaped spin base 16 that is substantially horizontally attached to an upper end of the spin shaft 15.

The spin base 16 includes a horizontal circular upper surface 16a that has an outer diameter greater than an outer diameter of the substrate W. A plurality of (three or more, e.g., six) gripping members 17 are disposed on the upper surface 16a at a peripheral edge portion of the upper surface 16a. The gripping members 17 are disposed with suitable intervals therebetween, e.g., with equal intervals therebetween, on a circumference corresponding to an outer peripheral shape of the substrate W in the peripheral edge portion of the upper surface of the spin base 16.

The SPM supply unit 9 includes an SPM nozzle 18, a nozzle arm 19 that has a forward end portion to which the SPM nozzle 18 is attached, and a nozzle moving unit 20 that moves the SPM nozzle 18 by moving the nozzle arm 19.

The SPM nozzle 18 is, for example, a straight nozzle that expels an SPM in a continuous flow state. The SPM nozzle 18 is attached to the nozzle arm 19 in, for example, a perpendicular attitude in which a processing liquid is expelled in a direction perpendicular to the upper surface of the substrate W. The nozzle arm 19 extends in the horizontal direction.

The nozzle moving unit 20 horizontally moves the SPM nozzle 18 by horizontally moving the nozzle arm 19 around a swing axis. The nozzle moving unit 20 horizontally moves the SPM nozzle 18 between a processing position at which an SPM expelled from the SPM nozzle 18 lands on the upper surface of the substrate W and a retreat position at which the SPM nozzle 18 is set around the spin chuck 8 in a plan view. In the present preferred embodiment, the processing position is, for example, a central position at which an SPM expelled from the SPM nozzle 18 lands on a central portion of the upper surface of the substrate W.

The SPM supply unit 9 additionally includes a sulfuric acid supply unit 21 that supplies $H_2SO_4$ to the SPM nozzle 18 and a hydrogen-peroxide-water supply unit 22 that supplies $H_2O_2$ to the SPM nozzle 18.

The sulfuric acid supply unit 21 includes a sulfuric acid piping 23 that has its end connected to the SPM nozzle 18, a sulfuric acid valve 24 that opens and closes the sulfuric acid piping 23, a sulfuric-acid-flow-rate regulating valve 25 that regulates the flow rate of $H_2SO_4$ flowing through the sulfuric acid piping 23 while regulating the opening degree of the sulfuric acid piping 23, and a sulfuric acid supply portion 26 to which the other end of the sulfuric acid piping 23 is connected. The sulfuric acid valve 24 and the sulfuric-acid-flow-rate regulating valve 25 are housed in the fluid box 4. The sulfuric acid supply portion 26 is housed in the storage box 6.

The sulfuric-acid-flow-rate regulating valve 25 includes a valve body inside which a valve seat is disposed, a valving element that opens and closes the valve seat, and an actuator that moves the valving element between an opening position and a closing position. The same applies to the other flow-rate regulating valves.

The sulfuric acid supply portion 26 includes the sulfuric-acid tank 27 that stores $H_2SO_4$ that is to be supplied to the sulfuric acid piping 23, a sulfuric-acid replenishing piping 28 that replenishes sulfuric-acid tank 27 with a new liquid of $H_2SO_4$, a recovery tank 29, a liquid-feeding piping 30 that sends $H_2SO_4$ stored in the recovery tank 29 to the sulfuric-acid tank 27, a first liquid-feeding device 31 that moves $H_2SO_4$ contained in the recovery tank 29 to the liquid-feeding piping 30, a sulfuric acid supply piping 32 by which the sulfuric-acid tank 27 and the sulfuric acid piping 23 are connected together, a temperature regulator 33 that performs the regulation of temperature while heating sulfuric acid flowing through the sulfuric acid supply piping 32, and a second liquid-feeding device 34 that moves $H_2SO_4$ contained in the sulfuric-acid tank 27 to the sulfuric acid supply piping 32. The temperature regulator 33 may be immersed in $H_2SO_4$ of the sulfuric-acid tank 27, and may be interposed in a halfway portion of the sulfuric acid supply piping 32 as shown in FIG. 2. The sulfuric acid supply portion 26 may additionally include a filter that filters sulfuric acid flowing through the sulfuric acid supply piping 32 and/or a thermometer that measures the temperature of sulfuric acid flowing through the sulfuric acid supply piping 32. Although the sulfuric acid supply portion 26 has the two tanks in the present preferred embodiment, the configuration of the recovery tank 29 may be eliminated, and a configuration in which sulfuric acid recovered from the processing cup 11 is supplied directly to the sulfuric-acid tank 27 may be employed. The first and second liquid-feeding devices 31 and 34 are, for example, pumps, respectively. The pump sucks $H_2SO_4$ contained in the sulfuric-acid tank 27, and expels $H_2SO_4$ sucked thereinto.

The hydrogen-peroxide-water supply unit 22 includes a hydrogen-peroxide-water piping 35 connected to the SPM nozzle 18, a hydrogen-peroxide-water valve 36 that opens and closes the hydrogen-peroxide-water piping 35, and a hydrogen-peroxide-water-flow-rate regulating valve 37 that regulates the flow rate of $H_2O_2$ flowing through the hydrogen-peroxide-water valve 36 while regulating the opening degree of the hydrogen-peroxide-water valve 36. The hydrogen-peroxide-water valve 36 and the hydrogen-peroxide-water-flow-rate regulating valve 37 are housed in the fluid box 4. $H_2O_2$ that has not undergone temperature regulation and that has normal temperatures (about 23° C.) is supplied from a hydrogen-peroxide-water supply source housed in the storage box 6 to the hydrogen-peroxide-water piping 35.

When the sulfuric acid valve 24 and the hydrogen-peroxide-water valve 36 are opened, $H_2SO_4$ from the sulfuric acid piping 23 and $H_2O_2$ from the hydrogen-peroxide-water piping 35 are supplied to the inside of a casing (not shown) of the SPM nozzle 18, and are sufficiently mixed (stirred) in the casing. As a result of this mixture, $H_2SO_4$ and $H_2O_2$ are evenly mixed together. A mixed liquid (SPM) of $H_2SO_4$ and $H_2O_2$ is generated by a reaction between $H_2SO_4$ and $H_2O_2$. The SPM includes peroxomonosulfuric acid ($H_2SO_5$) having strong oxidative power, and is heated to a temperature (not less than 100° C.; for example, 160° C. to 220° C.) higher than temperatures of $H_2SO_4$ and $H_2O_2$ that have not yet mixed together. The SPM generated in this way and having a high temperature is expelled from an expelling port formed in a front end (for example, lower end) of the casing of the SPM nozzle 18.

It is possible to regulate the concentration of $H_2SO_4$ of an SPM that is expelled from the SPM nozzle 18 within a predetermined range by regulating the opening degree of the sulfuric acid piping 23 and that of the hydrogen-peroxide-water piping 35 by means of the sulfuric-acid-flow-rate regulating valve 25 and the hydrogen-peroxide-water-flow-rate regulating valve 37. The concentration (mixture ratio) of $H_2SO_4$ of an SPM that is expelled from the SPM nozzle 18 is regulated within the range of $H_2SO_4:H_2O_2=20:1$ (highly-concentrated state in which sulfuric acid is rich) to 2:1 (low-concentrated state in which hydrogen peroxide water is rich) in the flow ratio, more preferably, within the range of $H_2SO_4:H_2O_2=10:1$ to 5:1 in the flow ratio.

The sulfuric acid supply portion 26 reuses an SPM recovered from the processing cup 11 as $H_2SO_4$. The SPM recovered from the processing cup 11 is supplied to the recovery tank 29, and is stored in the recovery tank 29. With the lapse of time, $H_2O_2$ included in the SPM is decomposed, and the SPM stored in the recovery tank 29 is changed into sulfuric acid. However, sulfuric acid into which the SPM has been changed includes a large quantity of water, and therefore there is a need to regulate its concentration. In the sulfuric acid supply portion 26, $H_2SO_4$ contained in the recovery tank 29 is sent to the sulfuric-acid tank 27, and undergoes concentration regulation in the sulfuric-acid tank 27. Hence, the SPM is reused as $H_2SO_4$.

The rinse liquid supply unit 10 includes a rinse liquid nozzle 47. The rinse liquid nozzle 47 is, for example, a straight nozzle that expels a liquid in a continuous flow state, and is fixedly disposed above the spin chuck 8 such that its expelling port faces the central portion of the upper surface of the substrate W. A rinse liquid piping 48 to which a rinse liquid from a rinse liquid supply source is supplied is connected to the rinse liquid nozzle 47. A rinse liquid valve 49 that performs switching between the supply and the supply stop of a rinse liquid from the rinse liquid nozzle 47 is interposed in a halfway portion of the rinse liquid piping 48. When the rinse liquid valve 49 is opened, a rinse liquid supplied from the rinse liquid piping 48 to the rinse liquid nozzle 47 is expelled from the expelling port formed at a lower end of the rinse liquid nozzle 47. When the rinse liquid valve 49 is closed, the supply of the rinse liquid from the rinse liquid piping 48 to the rinse liquid nozzle 47 is stopped. The rinse liquid is, for example, deionized water (DIW), and yet, without being limited to DIW, the rinse liquid may be any one of carbonated water, electrolyzed ion water, hydrogen water, ozone water, ammonia water, and aqueous hydrochloric acid solution having a diluted concentration (e.g., about 10 ppm to 100 ppm). Also, the rinse liquid may be used at a normal temperature, or may be used as warm water by being heated.

Also, the rinse liquid supply unit 10 may include a rinse-liquid-nozzle moving device that scans the landing position of a rinse liquid with respect to the upper surface of the substrate W within the plane of the substrate W by moving the rinse liquid nozzle 47.

The processing cup 11 is disposed outwardly (in a direction away from the rotational axis A1) from the substrate W held by the spin chuck 8. The processing cup 11 is made of, for example, an insulating material. The processing cup 11 surrounds the lateral side of the spin base 16. When a processing liquid is supplied to the substrate W in a state in which the spin chuck 8 rotates the substrate W, the processing liquid supplied to the substrate W is shaken off around the substrate W. When the processing liquid is supplied to the substrate W, an upper end portion 11a of the processing cup 11 that is upwardly open is arranged above the spin base 16. Therefore, the processing liquid, such as a chemical liquid or water, etc., that has been drained around the substrate W is caught by the processing cup 11. Thereafter, the processing liquid caught by the processing cup 11 is sent to the recovery tank 29 or to a waste liquid device (not shown).

The processing cup 11 includes a circular cylindrical member 40, a plurality of cups (first and second cups 41 and 42) fixedly disposed so as to doubly surround the spin chuck 8 inside the circular cylindrical member 40, a plurality of guards (first, second, and third guards 43, 44, and 45) each of which catches a processing liquid (chemical liquid or rinse liquid) that has scattered from the periphery of the substrate W, and a guard elevating/lowering unit 46 that independently raises and lowers the respective guards. The guard elevating/lowering unit 46 is configured to include, for example, a ball screw mechanism.

The processing cup 11 is collapsible, and is unfolded and folded by allowing the guard elevating/lowering unit 46 to raise and lower at least one of the three guards.

The first cup 41 has an annular shape, and surrounds the periphery of the spin chuck 8 between the spin chuck 8 and the circular cylindrical member 40. The first cup 41 has a substantially rotationally symmetrical shape with respect to the rotational axis A1 of the substrate W. The first cup 41 cross-sectionally has the shape of the capital letter U, and defines a first groove 50 that is used to collect and drain a processing liquid that has been used to process the substrate W. A drain port 51 is bored in a lowest place of a bottom portion of the first groove 50, and a first drain piping 52 is connected to the drain port 51. A processing liquid introduced into the first drain piping 52 is sent to a drain device (not shown; may be a waste liquid device), and is processed by this device.

The second cup 42 has an annular shape, and surrounds the periphery of the first cup 41. The second cup 42 has a substantially rotationally symmetrical shape with respect to the rotational axis A1 of the substrate W. The second cup 42 sectionally has the shape of the capital letter U, and defines a second groove 53 that is used to gather and collect a processing liquid that has been used to process the substrate W. A drain/recovery port 54 is bored in a lowest position of a bottom portion of the second groove 53, and a common piping 55 is connected to the drain/recovery port 54. A recovery piping 56 and a second drain piping 57 are connected in a branching manner to the common piping 55. The other end of the recovery piping 56 is connected to the recovery tank 29 of the sulfuric acid supply portion 26. A recovery valve 58 is interposed in the recovery piping 56, and a drain valve 59 is interposed in the second drain piping 57. A liquid flowing through the common piping 55 is guided to the recovery piping 56 by opening the recovery valve 58 while closing the drain valve 59. Likewise, a liquid flowing through the common piping 55 is guided to the second drain piping 57 by opening the drain valve 59 while closing the recovery valve 58. That is, the recovery valve 58 and the drain valve 59 function as a switching unit that performs switching to change the flow destination of a liquid flowing through the common piping 55 between the recovery piping 56 and the second drain piping 57. When an inner wall 44a of the second guard 44, the second cup 42, and the common piping 55 are cleaned, the second drain piping 57 is solely used to throw away a cleaning liquid used to clean these components.

The innermost first guard 43 surrounds the periphery of the spin chuck 8, and has a substantially rotationally symmetrical shape with respect to the rotational axis A1 of the substrate W by means of the spin chuck 8. The first guard 43 includes a circular cylindrical lower end portion 63 that surrounds the periphery of the spin chuck 8, a cylindrical portion 64 that extends outwardly (i.e., in a direction receding from the rotational axis A1 of the substrate W) from an upper end of the lower end portion 63, a circular cylindrical middle portion 65 that extends vertically upwardly from an outer peripheral portion of an upper surface of the cylindrical portion 64, and an annular upper end portion 66 that extends obliquely upwardly from an upper end of the middle portion 65 toward the inner side (i.e., in a direction approaching the rotational axis A1 of the substrate W). The lower end portion 63 is positioned on the first groove 50, and is housed within the first groove 50 in a state in which the first guard 43 and the first cup 41 are closest to each other. An inner peripheral edge of the upper end portion 66 has a circular shape larger in diameter than the substrate W held by the spin chuck 8 in a plan view. The upper end portion 66 may be sectionally linear as shown in FIG. 2, or may extend, for example, while drawing a smooth circular arc.

The second guard 44 that is a second one from the inside surrounds the periphery of the spin chuck 8 at an outer side of the first guard 43, and has a substantially rotationally symmetrical shape with respect to the rotational axis A1 of the substrate W by means of the spin chuck 8. The second guard 44 has a circular cylindrical portion 67 coaxial with the first guard 43 and an upper end portion 68 that extends obliquely upwardly on the center side (i.e., in a direction approaching the rotational axis A1 of the substrate W) from an upper end of the circular cylindrical portion 67. An inner peripheral edge of the upper end portion 68 has a circular shape larger in diameter than the substrate W held by the spin chuck 8 in a plan view. The upper end portion 68 may be sectionally linear as shown in FIG. 2, or may extend, for example, while drawing a smooth circular arc. A front end of the upper end portion 68 defines an opening of the upper end portion 11a of the processing cup 11.

The circular cylindrical portion 67 is positioned on the second groove 53. The upper end portion 68 is disposed so as to lie on the upper end portion 66 of the first guard 43 in an up-down direction, and is formed so as to approach the upper end portion 66 with a slight gap therebetween in a state in which the first guard 43 and the second guard 44 are closest to each other.

The outermost third guard 45 surrounds the periphery of the spin chuck 8 at an outer side of the second guard 44, and has a substantially rotationally symmetrical shape with respect to the rotational axis A1 of the substrate W by means of the spin chuck 8. The third guard 45 has a circular cylindrical portion 70 coaxial with the second guard 44 and an upper end portion 71 that extends obliquely upwardly on the center side (i.e., in a direction approaching the rotational axis A1 of the substrate W) from an upper end of the circular cylindrical portion 70. An inner peripheral edge of the upper end portion 71 has a circular shape larger in diameter than the substrate W held by the spin chuck 8 in a plan view. The upper end portion 71 may be sectionally linear as shown in FIG. 2, or may extend, for example, while drawing a smooth circular arc.

In the present preferred embodiment, a first flow space (that is, a drain space) 101 to which a chemical liquid that has been used to process the substrate W is guided is defined by the first groove 50 of the first cup 41, an inner wall 43*a* of the first guard 43, and an outer periphery of a casing of the spin chuck 8.

A second flow space (that is, a recovery space) 102 to which a chemical liquid that has been used to process the substrate W is guided is defined by the second groove 53 of the second cup 42, an outer wall 43*b* of the first guard 43, and the inner wall 44*a* of the second guard 44. The first flow space 101 and the second flow space 102 are isolated from each other.

The guard elevating/lowering unit 46 raises and lowers the first to third guards 43 to 45 between an upper position in which the upper end portion of the guard is arranged above the substrate W and a lower position in which the upper end portion of the guard is arranged below the substrate W, respectively. The guard elevating/lowering unit 46 can hold each guard at an arbitrary position between the upper position and the lower position. The substrate W is supplied with a processing liquid or is dried in a state in which any one of the guards (the first, second, or third guard 43, 44, or 45) faces a peripheral end surface of the substrate W.

All of the first to third guards 43 to 45 are arranged at the upper position (processing height position) in a first guard facing state of the processing cup 11 (see FIG. 6A) in which the innermost first guard 43 is allowed to face the peripheral end surface of the substrate W. The second and third guards 44 and 45 are arranged at the upper position, and, simultaneously, the first guard 43 is arranged at the lower position in a second guard facing state of the processing cup 11 (see FIG. 6C) in which the second guard 44 that is a second one from the inside is allowed to face the peripheral end surface of the substrate W. The third guard 45 is arranged at the upper position, and, simultaneously, the first and second guards 43 and 44 are arranged at the lower position in a third guard facing state of the processing cup 11 (see FIG. 6D) in which the outermost third guard 45 is allowed to face the peripheral end surface of the substrate W. All of the first to third guards 43 to 45 are arranged at the lower position in a retreated state (see FIG. 2) in which all guards are allowed to retreat from the peripheral end surface of the substrate W.

As described later, a first guard cleaning state in which the first guard 43 is arranged at a cleaning height position WP (see FIG. 6B) set below the upper position (processing height position) PP (see FIG. 6A) while placing both the second and third guards 44 and 45 at the upper position is prepared in addition to the first guard facing state that is a state in which the first guard 43 faces the peripheral end surface of the substrate W in the present preferred embodiment.

Figure 3:
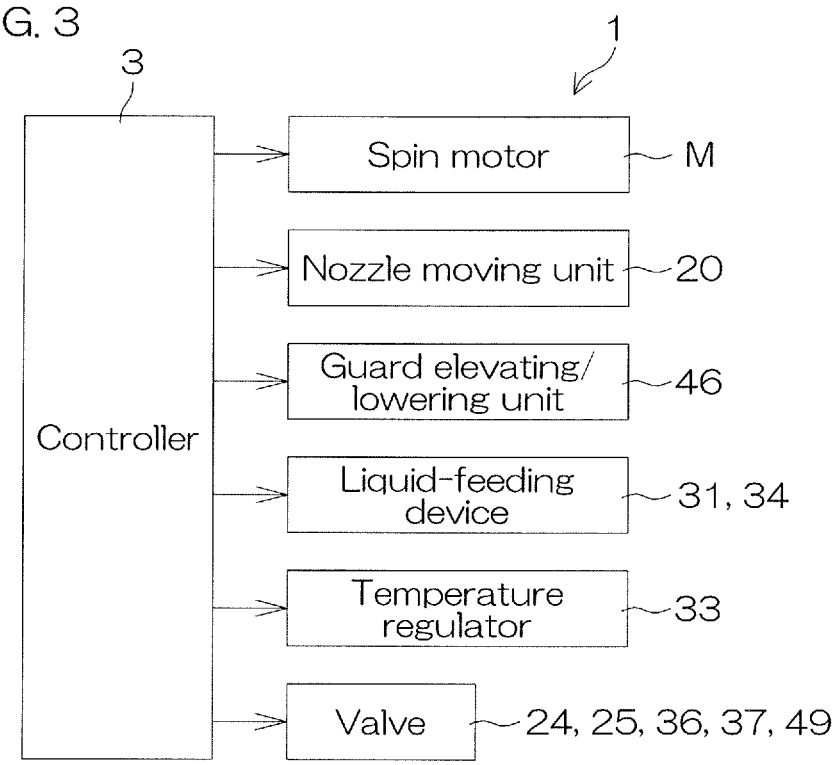
FIG. 3 is a block diagram for describing an electrical configuration of a main part of the substrate processing apparatus.

FIG. 3 is a block diagram for describing an electrical configuration of a main part of the substrate processing apparatus 1.

The controller 3 is configured by use of, for example, a microcomputer. The controller 3 has an arithmetic unit such as a CPU, etc., a storage unit such as a read-only memory device or a hard disk drive, etc., and an input-output unit. The storage unit includes a computer-readable recording medium that records a program that is executed by the arithmetic unit. A step group is incorporated in the recording medium so as to allow the controller 3 to perform resist removal processing described later.

The controller 3 controls operations of the spin motor M, the nozzle moving unit 20, the guard elevating/lowering unit 46, the first and second liquid-feeding devices 31 and 34, the temperature regulator 33, etc., in accordance with a predetermined program. Also, the controller 3 controls open-close operations of the sulfuric acid valve 24, the hydrogen-peroxide-water valve 36, the rinse liquid valve 49, etc., in accordance with a predetermined program. Also, the controller 3 regulates opening degrees of both the sulfuric-acid-flow-rate regulating valve 25 and the hydrogen-peroxide-water-flow-rate regulating valve 37 in accordance with a predetermined program.

Figure 4:
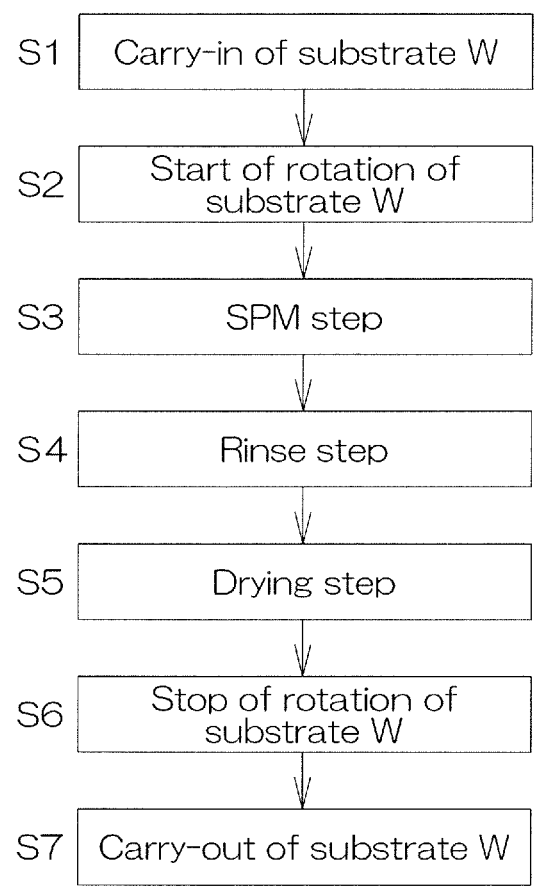
FIG. 4 is a flowchart for describing a substrate processing example performed by the processing unit.

FIG. 4 is a flowchart for describing a substrate processing example performed by the processing unit 2. The substrate processing example will be described with reference to FIG. 1 to FIG. 4.

This substrate processing example is resist-removing processing that removes a resist from the upper surface (main surface) of the substrate W. The resist uses an organic substance such as a resin (polymer), etc., a photosensitizer, an additive, and a solvent as chief constituents. When the substrate processing example is applied to the substrate W by means of the processing unit 2, the substrate W that has undergone ion implantation processing with a high dose is carried into the chamber 7 (S1 of FIG. 4). Let it be supposed that the substrate W has not undergone processing for the ashing of the resist.

The controller 3 allows a hand of the substrate transfer robot CR (See FIG. 1) holding a substrate W to enter the inside of the chamber 7 in a state in which all of the nozzles and the like have retreated from above the spin chuck 8, and, as a result, the substrate W is delivered to the spin chuck 8, and is held by the spin chuck 8 in a state in which its front surface (device forming surface) is directed upwardly (Substrate Holding Step).

The controller 3 allows the spin motor M to start rotating the substrate W (S2 of FIG. 4. Substrate Rotating Step). The substrate W is raised in rotational speed to a predetermined liquid processing speed (within a range of 300 to 1500 rpm and of, for example, 500 rpm), and is maintained at the liquid processing speed.

When the rotation speed of the substrate W reaches the liquid processing speed, the controller 3 executes an SPM step (Chemical liquid Supply Step) S3.

In detail, the controller 3 allows the SPM nozzle 18 to move from the retreat position to the processing position by controlling the nozzle moving unit 20. Furthermore, the controller 3 simultaneously opens the sulfuric acid valve 24 and the hydrogen-peroxide-water valve 36. Hence, $H_2SO_4$ is supplied to the SPM nozzle 18 through the sulfuric acid piping 23, and $H_2O_2$ is supplied to the SPM nozzle 18 through the hydrogen-peroxide-water piping 35. $H_2SO_4$ and $H_2O_2$ are mixed together inside the SPM nozzle 18, and a high-temperature SPM (for example, 160° C. to 220° C.) is generated. This SPM is expelled from the expelling port of the SPM nozzle 18, and lands on the central portion of the upper surface of the substrate W. In the present preferred embodiment, the concentration of the SPM is kept constant over the entire period of the SPM step S3.

The SPM expelled from the SPM nozzle 18 lands on the upper surface of the substrate W, and then flows outwardly along the upper surface of the substrate W because of a centrifugal force. Therefore, the SPM is supplied to the whole area of the upper surface of the substrate W, and a liquid film of the SPM with which the whole area of the upper surface of the substrate W is covered is formed on the substrate W. Hence, the resist and the SPM chemically react with each other, and the resist on the substrate W is removed from the substrate W by means of the SPM. The SPM that has moved to a peripheral edge portion of the substrate W scatters sidewardly from the peripheral edge portion of the substrate W.

In the SPM step S3, the controller 3 may allow the SPM nozzle 18 to move between a peripheral edge position facing the peripheral edge portion of the upper surface of the substrate W and a central position facing the central portion of the upper surface of the substrate W by controlling the nozzle moving unit 20. In this case, the landing position of the SPM in the upper surface of the substrate W is scanned over the whole area of the upper surface of the substrate W. This makes it possible to evenly process the whole area of the upper surface of the substrate W.

When a predetermined period of time elapses from the start of the expelling of the SPM, the controller 3 closes the sulfuric acid valve 24 and the hydrogen-peroxide-water valve 36, and stops expelling the SPM from the SPM nozzle 18. Hence, the SPM step S3 is ended. Thereafter, the controller 3 allows the SPM nozzle 18 to return to the retreat position by controlling the nozzle moving unit 20 (See FIG. 2).

Thereafter, a rinse step (Different-Liquid Supply Step. S4 of FIG. 4) of supplying a rinse liquid to the substrate W is performed. In detail, the controller 3 opens the rinse liquid valve 49, and allows the rinse liquid nozzle 47 to expel a rinse liquid toward the central portion of the upper surface of the substrate W. The rinse liquid expelled from the rinse liquid nozzle 47 lands on the central portion of the upper surface of the substrate W covered with the SPM. The rinse liquid that has landed on the central portion of the upper surface of the substrate W receives a centrifugal force generated by the rotation of the substrate W, and flows on the upper surface of the substrate W toward the peripheral edge portion of the substrate W. Hence, the SPM on the substrate W is swept away outwardly by means of the rinse liquid, and is drained to surroundings of the substrate W. Hence, the SPM and the resist (i.e., resist residue) are rinsed away in the whole area of the upper surface of the substrate W. The resist residue is, for example, carbide. When a predetermined period of time elapses from the start of the rinse step S4, the controller 3 closes the rinse liquid valve 49, and allows the rinse liquid nozzle 47 to stop expelling the rinse liquid therefrom.

Thereafter, a drying step (S5 of FIG. 4) of drying the substrate W is performed.

In the drying step S5, in detail, the controller 3 controls and allows the spin motor M to accelerate the substrate W to a drying rotation speed (for example, several thousand rpm) greater than the rotation speed employed until the SPM step S3 and until the rinse step S4 and to rotate the substrate W at the drying rotation speed. Hence, a large centrifugal force is applied to a liquid on the substrate W, and the liquid adhering to the substrate W is shaken off to the surroundings of the substrate W. The liquid is removed from the substrate Win this way, and the substrate W is dried.

Thereafter, when a predetermined period of time elapses after the high-speed rotation of the substrate W is started, the controller 3 controls and allows the spin motor M to stop the rotation of the substrate W by means of the spin chuck 8 (S6 of FIG. 4).

Thereafter, the substrate W is carried out from the inside of the chamber 7 (S7 of FIG. 4). In detail, the controller 3 allows the hand of the substrate transfer robot CR to enter the inside of the chamber 7. Thereafter, the controller 3 allows the hand of the substrate transfer robot CR to hold the substrate W on the spin chuck 8. Thereafter, the controller 3 allows the hand of the substrate transfer robot CR to retreat from the inside of the chamber 7. Hence, the substrate W in which the resist has been removed from the front surface (the device forming surface) is carried out of the chamber 7.

Figure 5:
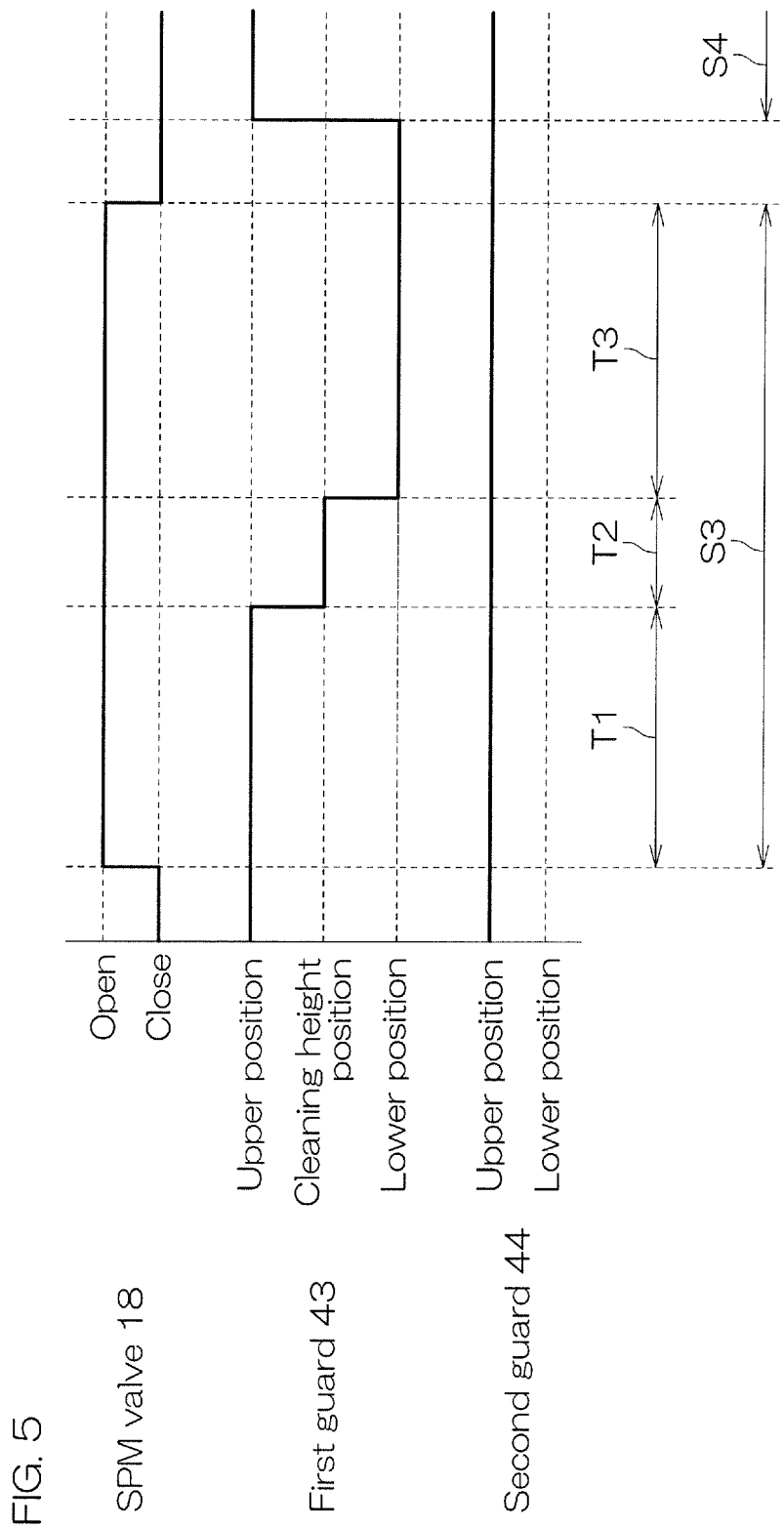
FIG. 5 is a timing chart for describing an up-and-down timing of a guard in an SPM step.
Figure 6A:
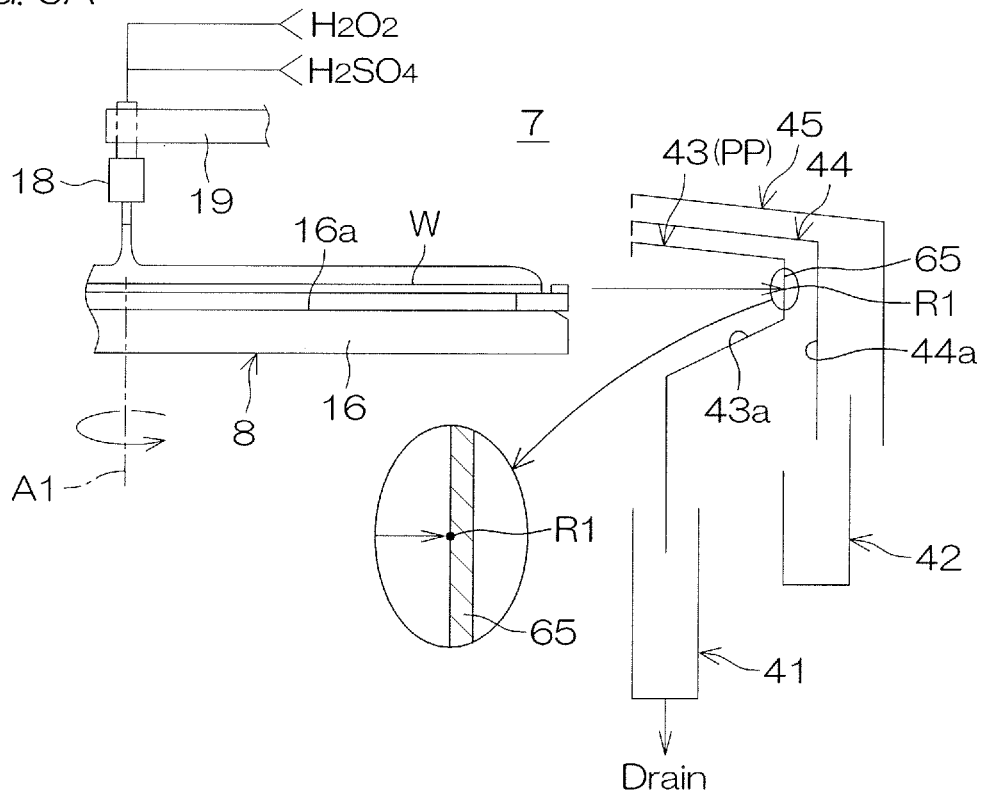
FIGS. 6A to 6C are illustrative views to describe the SPM step.
Figure 6B:
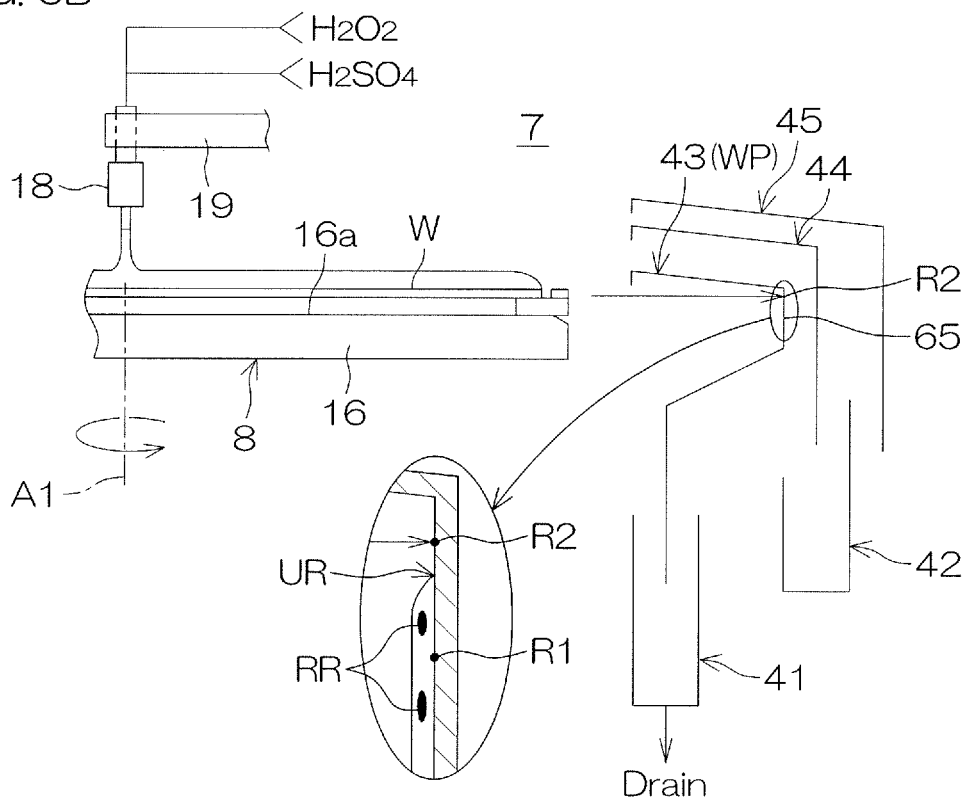
Figure 6C:
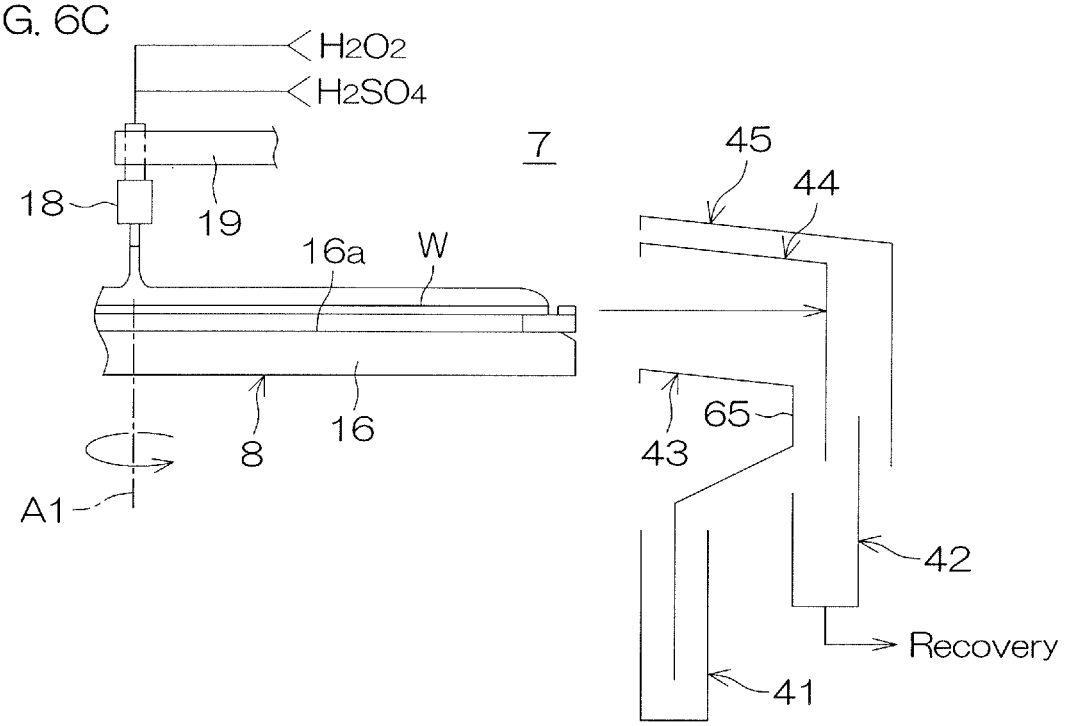
Figure 6D:
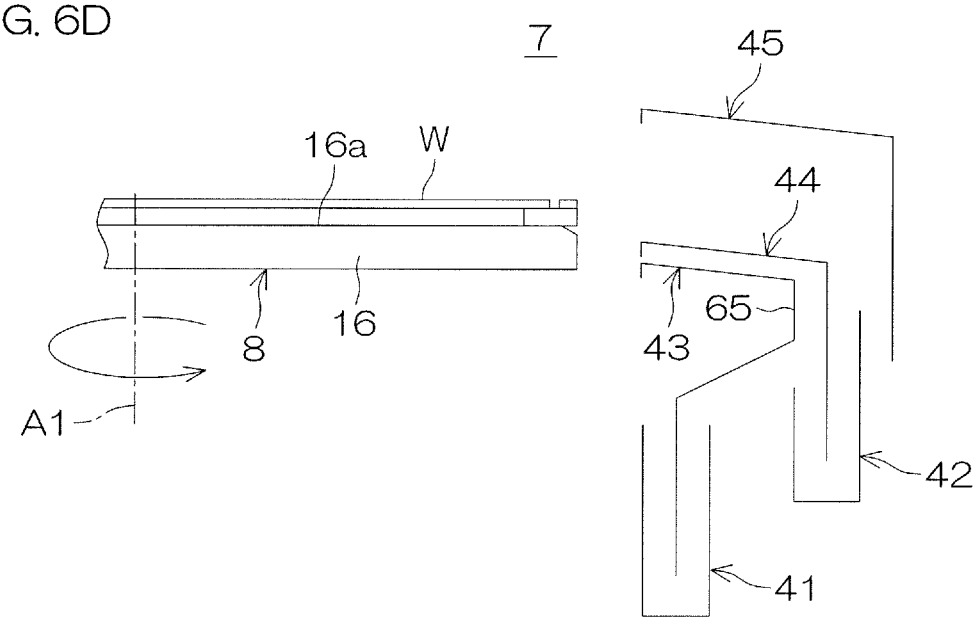
FIG. 6D is an illustrative view to describe a drying step.

FIG. 5 is a timing chart for describing up-and-down timings of the first and second guards 43 and 44 in the SPM step S3. FIGS. 6A to 6C are illustrative views to describe the SPM step S3. FIG. 6D is an illustrative view to describe the drying step S5.

With reference to FIG. 2 to FIG. 5, a description will be given of up-and-down movements of the first and second guards 43 and 44 (i.e., switching of guards facing the peripheral end surface of the substrate W (guards arranged at a position at which a processing liquid expelled from the substrate W can be captured) (Guard Switching Step)) in the substrate processing example shown in FIG. 4. Reference is appropriately made to FIGS. 6A to 6D.

The SPM step S3 includes a first step T1 in which the processing cup 11 is in a first guard facing state, a second step T2 in which the processing cup 11 is in a first guard cleaning state, and a third step T3 in which the processing cup 11 is in a second guard facing state.

Many resist residues (foreign substances) exist on the front surface of the substrate W for a time after the SPM step S3 is started, and therefore a large amount of resist residues are included in the SPM that is scattered (is a expelled) from the substrate W for this period of time. The SPM including a large amount of resist residues is unsuitable for reusing, and therefore it is preferable to discard the SPM without collecting it. On the other hand, it is preferable to minimize the discarding of the SPM from the viewpoint of environmental considerations, and, if the SPM expelled from the substrate W comes not to include resist residues, it is preferable to collect and reuse the SPM. In this specification, the expression "resist residues are not included" semantically includes a case of "resist residues are not included at all," a case of "resist residues are hardly included," and a case of "only a tiny amount of resist residues are included."

In the substrate processing example shown in FIG. 4, the processing cup 11 is in a retreated state before the substrate is carried in (S1). In the SPM step S3, the SPM nozzle 18 is arranged at the processing position, and then the controller 3 controls and allows the guard elevating/lowering unit 46 to raise the first to third guards 43 to 45 to the upper position, and, as a result, the peripheral end surface of the substrate W is allowed to face the first guard 43 as shown in FIG. 6A (achievement of the first guard facing state). Hence, the first step T1 is started. This state is maintained in the first step T1 (Processing-Height Maintaining Step).

In the SPM step S3 (first step T1), the SPM scattering from the peripheral edge portion of the substrate W lands on an annular first region R1 of the inner wall 43a of the first guard 43. The SPM captured by the inner wall 43a flows down along the inner wall 43a of the first guard 43, and is received by the first cup 41, and is sent to the first drain piping 52. The SPM sent to the first drain piping 52 is sent to disposal processing facilities provided outside the apparatus.

As described above, a large amount of resist residues are included in the SPM scattered (expelled) from the substrate W for a time after the SPM step S3 is started. In the first step T1, the SPM that has been expelled from the substrate W and that includes resist residues is drained through the first flow space 101. That is, the SPM is not recovered and reused.

In the first step T1, the SPM that has landed on the first region R1 of the inner wall 43a adheres to the inner wall 43a of the first guard 43 while spreading in the up-down direction as shown in FIG. 6A and FIG. 6B. Let it be assumed that an upper end of a region at which the SPM, which has landed on the first region R1, arrives is defined as an arrival-region upper end (an upper end of an arrival region) UR. Resist residues RR (see FIG. 6A and FIG. 6B) are included in the SPM scattered from the substrate W, and therefore there is a fear that resist residues RR will adhere to a region below the annular arrival-region upper end UR in the inner wall 43a of the first guard 43.

When a predetermined cleaning period of time elapses from the start of the expelling of an SPM, the first step T1 is ended, and then the second step T2 is started. The cleaning period of time is a predetermined period of time subsequent to a state in which an SPM expelled from the substrate W no longer includes resist residues from the start of the expelling of an SPM. The cleaning period of time is calculated by a pre-experiment or the like, and is stored in the storage unit of the controller 3. The cleaning period of time may be variously determined depending on various conditions (at least one among a condition (dose amount) for ion implantation processing of a to-be-processed substrate W, the kind of a resist formed on the substrate W, the supply flow rate of an SPM in the first step T1, and the supply concentration of an SPM in the first step T1).

In detail, the controller 3 controls the guard elevating/lowering unit 46, and lowers the first guard 43 to the cleaning height position WP (see FIG. 6B) from the upper position PP (see FIG. 6A) at which the first guard 43 has been so far arranged as shown in FIG. 6B (achievement of the first guard cleaning state). Thereafter, the controller 3 allows the first guard 43 to be maintained at the cleaning height position WP (cleaning height maintaining step).

In the second step T2, the concentration of an SPM expelled from the SPM nozzle 18, the flow rate of an SPM, the rotation speed of the substrate W are the same as in the first step T1. In the second step T2, an SPM scattering from the peripheral edge portion of the substrate W lands on an annular second region R2 of the inner wall 43a of the first guard 43 (i.e., a position at which the inner wall 43a of the first guard 43 arranged at the cleaning height position WP captures the SPM). In the inner wall 43a of the first guard 43, the second region R2 is arranged above the first region R1. In more detail, the second region R2 is set at a higher position than the arrival-region upper end UR. Therefore, it is possible to excellently wash away substantially all of the SPM including resist residues, which adhere to a region below the annular arrival-region upper end UR of the inner wall 43a, by means of the SPM captured by the first guard 43 arranged at the cleaning height position WP. This cleaning operation is fully satisfied if resist residues can be cleaned away from the inner wall 43a. Therefore, the inner wall 43a is cleaned by use of the SPM that is the chemical liquid.

The SPM flowing down the inner wall 43a of the first guard 43 is sent to the disposal processing facilities provided outside the apparatus through the first cup 41 and through the first drain piping 52. That is, in the second step T2, the SPM scattering from the peripheral edge portion of the substrate W is likewise drained through the first flow space 101. That is, the SPM is not recovered and reused.

When a predetermined cleaning period of time elapses from the placement of the first guard 43 to the cleaning height position WP, the second step T2 is ended, and then the third step T3 is started.

That is, the guard facing the peripheral end surface of the substrate W is switched from the first guard 43 to the second guard 44 (Guard Switching Step). In detail, the controller 3 controls the guard elevating/lowering unit 46, and lowers the first guard 43 to the lower position from the cleaning height position WP (see FIG. 6B) at which the first guard 43 has been so far arranged as shown in FIG. 6C (achievement of the second guard facing state). When the guard is switched in this way, both the flow rate of the SPM expelled from the SPM nozzle 18 and the rotation speed of the substrate W do not undergo a change.

The cleaning period of time mentioned here is a period of time long enough to remove resist residues from the inner wall 43a of the first guard 43. The cleaning period of time is calculated by a pre-experiment or the like, and is stored in the storage unit of the controller 3.

In the third step T3, the concentration of an SPM expelled from the SPM nozzle 18, the flow rate of an SPM, the rotation speed of the substrate W are the same as in the first step T1. In the third step T3, an SPM scattering from the peripheral edge portion of the substrate W is captured by the inner wall 44a of the second guard 44. Thereafter, the SPM flowing down along the inner wall 44a of the second guard 44 is sent to the recovery tank 29 of the sulfuric acid supply portion 26 through the second cup 42, the common piping 55, and the recovery piping 56. That is, in the third step T3, the SPM scattering from the peripheral edge portion of the substrate W is recovered through the second flow space 102, and is reused.

Thereafter, when the end timing of the SPM step S3 is reached, the third step T3 is also ended.

In the rinse step S4 executed subsequently to the SPM step S3, the processing cup 11 is in the first guard facing state. Therefore, after the end of the third step T3, the controller 3 controls the guard elevating/lowering unit 46, and raises the first guard 43 to the upper position (achievement of the first guard facing state).

In the drying step S5, the processing cup 11 is in the third guard facing state. Therefore, after the end of the rinse step S4, the controller 3 controls the guard elevating/lowering unit 46, and lowers the first and second guards 43 and 44 to the lower position (achievement of the third guard facing state is realized).

Before the substrate W is carried out (S7 of FIG. 4), the controller 3 controls the guard elevating/lowering unit 46, and lowers the third guard 45 to the lower position. Hence, all of the first to third guards 43 to 45 are arranged at the lower position (achievement of the retreated state).

As described above, according to the present preferred embodiment, the flow destination of the SPM expelled from the substrate W is switched from the first flow space 101 of the processing cup 11 to the second flow space 102 in parallel with the SPM step S3. This makes it possible to allow an SPM including resist residues and an SPM not including resist residues to flow to the first and second flow spaces 101 and 102 that are mutually different spaces in the processing cup 11. This makes it possible to allow an SPM including resist residues and an SPM not including resist residues to flow mutually separately inside the processing cup 11.

Also, the SPM flowing in the first flow space 101 is guided to the first drain piping 52, and the SPM flowing in the second flow space 102 is guided to the recovery piping 56. Therefore, the SPM including resist residues flows in the first flow space 101, and is guided to the first drain piping 52, whereas the SPM not including resist residues flows in the second flow space 102, and is guided to the recovery piping 56. Hence, it is possible to collect only the SPM not including resist residues. Therefore, it is possible to effectively restrain or prevent resist residues from being mixed with the SPM recovered as above.

Also, it is possible to switch the flow destination of an SPM expelled from the substrate W between the first flow space 101 and the second flow space 102 by switching the guard facing the peripheral end surface of the substrate W between the first guard 43 and the second guard 44. This makes it possible to easily switch the flow destination of an SPM expelled from the substrate W from one to the other.

Also, the first guard 43 and the second guard 44 are mutually adjoining guards, and therefore it is possible to allow the second guard 44 to face the peripheral end surface of the substrate W merely by lowering the first guard 43. Hence, it is possible to smoothly perform switching between the guards facing the peripheral end surface of the substrate W.

Also, in parallel with guard switching, an SPM is continuously supplied to the substrate W over the entire period of the up-and-down movement of the first guard 43. In this case, it is possible to make the period of time required in the SPM step S3 shorter, and it is possible to further improve throughput than in a case in which the supply of an SPM to the substrate W is stopped in the up-and-down movement of the first guard 43.

Also, according to the present preferred embodiment, in the SPM step S3, the first guard 43 is positionally changed to the cleaning height position WP set below the upper position PP from the upper position PP at which the first guard 43 has been so far arranged, and then the first guard 43 is maintained at the cleaning height position WP for a predetermined period of time.

Both in a state in which the first guard 43 is arranged at the upper position PP and in a state in which the first guard 43 is arranged at the cleaning height position WP, an SPM expelled from the substrate W is captured by the inner wall 43$a$ of the first guard 43. The SPM captured by the inner wall 43$a$ of the first guard 43 flows downwardly because of its own weight.

Also, in the inner wall 43$a$ of the first guard 43, the second region R2 is set at a higher position than the arrival-region upper end UR. Therefore, it is possible to excellently wash away substantially all of the SPM including resist residues, which adhere to a region below the annular arrival-region upper end UR of the inner wall 43$a$, by means of the SPM captured by the first guard 43 arranged at the cleaning height position WP.

Also, prior to the switching of the guard facing the peripheral end surface of the substrate W from the first guard 43 to the second guard 44, the first guard 43 is positionally changed to the cleaning height position WP from the upper position PP at which the first guard 43 has been so far arranged, and then the first guard 43 is maintained at the cleaning height position WP for a predetermined period of time. Prior to the switching between the first and second guards 43 and 44, the first guard 43 is arranged at the cleaning height position WP, and the inner wall 43$a$ of the first guard 43 is cleaned, and therefore it is possible to remove resist residues from the inner wall 43$a$ of the first guard 43 before the first guard 43 finishes being used.

Also, the guard facing the peripheral end surface of the substrate W is switched from the first guard 43 to the second guard 44 without allowing the first guard 43 to be again arranged at the processing height position after the first guard 43 is arranged at the cleaning height position. This makes it possible to perform switching between the first and second guards 43 and 44 immediately after the first guard 43 is cleaned, and hence makes it possible to shorten the processing time of the SPM step S3.

Although the preferred embodiment of the present invention has been described as above, the present invention can be embodied in other modes.

For example, although the cleaning of the first guard 43 (the second step T2) is performed only once in the SPM step S3 as described above, the cleaning of the first guard 43 (the second step T2) may be performed a plurality of times in the SPM step S3.

Also, although guard switching (transition to the third step T3) is performed immediately after the first guard 43 is cleaned (the second step T2) as described above, guard switching (transition to the third step T3) may be performed immediately after the first step T1 is executed (i.e., after the first facing state of the processing cup 11 is achieved) after the first guard 43 is cleaned (the second step T2).

Also, the third step T3 may be omitted. In this case, the SPM step S3 includes the first step T1 and the second step T2.

Also, although guard cleaning is performed in the first guard 43, guard cleaning may be performed in the other guards (i.e., the second guard 44 and/or the third guard 45).

Also, although the recovered SPM is reused as sulfuric acid in the substrate processing apparatus 1 according to the aforementioned preferred embodiment as described as a configuration example, the recovered SPM may be used in another device or the like without being reused in the substrate processing apparatus 1.

Also, the recovery piping 56 may be connected directly to the bottom portion of the second cup 42 without being connected through the common piping 55. An SPM stored in the second cup 42 is recovered into the sulfuric acid supply portion 26 through the common piping 55. In this case, the second drain piping 57 and the switching unit (the recovery valve 58 and the drain valve 59) are eliminated.

Also, in the aforementioned substrate processing example, a first cleaning step in which the upper surface of the substrate W is cleaned by use of a first cleaning chemical liquid may be executed prior to the SPM step S3. For example, hydrofluoric acid (HF) can be mentioned as the first cleaning chemical liquid. The first cleaning step is executed in a state in which the processing cup 11 is in the first guard facing state. Thereafter, a second rinse step in which the first cleaning chemical liquid is cleaned away by a rinse liquid is executed when the first cleaning step is executed. The second rinse step is executed in a state in which the processing cup 11 is in the first guard facing state.

Also, in the aforementioned substrate processing example, a hydrogen peroxide water supply step in which $H_2O_2$ is supplied to the upper surface (the front surface) of the substrate W may be executed prior to the rinse step S4 after the SPM step S3. In this case, the controller 3 closes only the sulfuric acid valve 24 while maintaining the hydrogen-peroxide-water valve 36 in an open state. Hence, only $H_2O_2$ is supplied to the SPM nozzle 18, and $H_2O_2$ is expelled from the expelling port of the SPM nozzle 18. In the hydrogen peroxide water supply step, the processing cup 11 is in the first guard facing state.

Also, in the aforementioned substrate processing example, a second cleaning step in which the upper surface of the substrate W is cleaned by use of a second cleaning chemical liquid may be executed after the rinse step S4. For example, SC1 (a mixed liquid that includes $NH_4OH$ and $H_2O_2$) can be mentioned as the second cleaning chemical liquid. The second cleaning step is executed in a state in which the processing cup 11 is in the first guard facing state. Thereafter, a third rinse step in which the second cleaning chemical liquid is cleaned away by a rinse liquid is executed when the second cleaning step is executed. The third rinse step is executed in a state in which the processing cup 11 is in the first guard facing state.

Also, an organic-solvent replacement step in which an organic solvent (drying liquid) that has a small surface tension is supplied, and then a rinse liquid on the upper surface of the substrate W is rearranged by the organic solvent may be executed prior to the drying step S5. The organic-solvent replacement step is executed in a state in which the processing cup 11 is in the third guard facing state.

Also, although a nozzle mixing type unit in which $H_2SO_4$ and $H_2O_2$ are mixed together inside the SPM nozzle 18 is mentioned as the SPM supply unit 9 as described in the first and second preferred embodiments as an example, a piping mixing type unit in which $H_2SO_4$ and $H_2O_2$ are mixed together in a mixing portion provided to be connected to an upstream side of the SPM nozzle 18 through a piping can be employed instead.

Also, although, for example, resist-removing processing is mentioned in the substrate processing example of FIG. 4, processing for removing other organic substances by use of an SPM may be employed without being limited to a resist.

Also, a chemical liquid that is supplied to the substrate W is not limited to the SPM, and other chemical liquids may be employed. BHF, DHF (dilute hydrofluoric acid), SC1 (ammonia-hydrogen peroxide mixture), SC2 (hydrochloric acid-hydrogen peroxide mixture), organic solvents (for example, NMP and acetone), nitric acid, ammonium phosphate, citric acid, sulfuric acid, dilute sulfuric acid, hydrofluoric nitric acid, undiluted HF, aqua regia, organic acids, such as TMAH (tetramethylammonium hydroxide aqueous solution), etc., and liquid mixtures of such organic acids can be mentioned. Besides, $O_3$ water may be employed. In this case, a metal, Si, or an organic substance is mentioned as a foreign substance included in the chemical liquid.

Also, although the processing cup 11 is a three-stage cup as described as an example, the processing cup 11 may be a one-stage cup (single cup), or may be a two-stage cup, or may be a multistage cup greater than four stages.

Also, although the substrate processing apparatus 1 is an apparatus that processes a front surface of a substrate W of a semiconductor wafer as described in the aforementioned preferred embodiment, the substrate processing apparatus may be an apparatus that processes substrates such as substrates for liquid crystal display devices, substrates for FPDs (Flat Panel Displays) such as an organic EL (electroluminescence) display device, etc., substrates for optical disks, substrates for magnetic disks, substrates for magneto-optical disks, substrates for photomasks, ceramic substrates, or substrates for solar cells, etc.

Although the preferred embodiments of the present invention have been described in detail, these preferred embodiments are merely concrete examples used to clarify the technical content of the present invention, and the present invention should not be understood by being limited to these concrete examples, and the scope of the present invention is limited solely by the appended claims.

What is claimed is:

1. A substrate processing apparatus comprising:
   a substrate holding unit that holds a substrate;
   a rotation unit that rotates a substrate held by the substrate holding unit around a rotational axis passing through a central portion of the substrate;
   a chemical liquid supply unit that supplies a chemical liquid to a main surface of a substrate held by the substrate holding unit;
   a cylindrical first guard that surrounds a periphery of the substrate holding unit and that captures a liquid expelled from a substrate held by the substrate holding unit;
   a guard elevating/lowering unit that raises and lowers the first guard; and
   a controller that controls the rotation unit, the chemical liquid supply unit, and the guard elevating/lowering unit,
   the controller executing: a chemical liquid supply step of supplying a chemical liquid by the chemical liquid supply unit to a main surface of a substrate held by the substrate holding unit while rotating the substrate around the rotational axis by the rotation unit; a processing-height maintaining step of maintaining the first guard at a processing height position by the guard elevating/lowering unit in parallel with the chemical liquid supply step such that the first guard captures the chemical liquid supplied to the main surface of the substrate and expelled from the substrate to be incident on a first region of the first guard; and a cleaning-height maintaining step of maintaining the first guard at a cleaning height position lower than the processing height position by the guard elevating/lowering unit in parallel with the chemical liquid supply step after the processing-height maintaining step such that the first guard captures the chemical liquid supplied to the main surface of the substrate and expelled from the substrate to be incident on a second region of the first guard that is higher in position than the first region with respect to the first guard.

2. The substrate processing apparatus according to claim 1, wherein the second region is set above an upper end to which the chemical liquid incident on the first region spreads on the first guard during the processing-height maintaining step.

3. The substrate processing apparatus according to claim 1, further comprising a cylindrical second guard that is provided separately from the first guard and that surrounds a periphery of the substrate holding unit and that captures a liquid expelled from a substrate held by the substrate holding unit,
   wherein the controller further executes a guard switching step of, after the cleaning-height maintaining step, arranging, in parallel with the chemical liquid supply step, the second guard such that the second guard, in place of the first guard, captures the chemical liquid supplied to the main surface of the substrate and expelled from the substrate to be incident on the second guard.

4. The substrate processing apparatus according to claim 3, wherein the controller executes the guard switching step after the cleaning-height maintaining step, without again executing the processing-height maintaining step.

5. The substrate processing apparatus according to claim 1, further comprising a different-liquid supply unit that supplies another processing liquid to a main surface of a substrate held by the substrate holding unit, the other processing liquid differing in kind from the chemical liquid supplied by the chemical liquid supply unit,
   wherein the controller further executes: a different-liquid supply step of supplying the other processing liquid to the main surface of the substrate by the different-liquid supply unit while rotating the substrate around the rotational axis by the rotation unit; and a step of placing the first guard at a position at which the first guard captures the other processing liquid supplied to the main surface of the substrate and expelled from the substrate to be incident on the first guard in parallel with the different-liquid supply step.

6. The substrate processing apparatus according to claim 1, wherein a resist is formed on the main surface of the substrate, and the chemical liquid supplied to the main surface of the substrate in the chemical liquid supply step includes an SPM (sulfuric acid/hydrogen peroxide mixture).

* * * * *